United States Patent

Hapke

[11] 4,336,495
[45] Jun. 22, 1982

[54] INTEGRATED CIRCUIT ARRANGEMENT IN MOS-TECHNOLOGY WITH FIELD-EFFECT TRANSISTORS

[75] Inventor: Friedrich Hapke, Hamburg, Fed. Rep. of Germany

[73] Assignee: U.S. Philips Corporation, New York, N.Y.

[21] Appl. No.: 117,884

[22] Filed: Feb. 1, 1980

[30] Foreign Application Priority Data

Feb. 12, 1979 [DE] Fed. Rep. of Germany ....... 2905294

[51] Int. Cl.³ ...................... G01R 31/22; G01R 15/12
[52] U.S. Cl. .............................. 324/158 T; 324/73 R; 324/158 R
[58] Field of Search ............. 324/158 T, 158 R, 73 R; 371/15

[56] References Cited

U.S. PATENT DOCUMENTS 3,815,025  6/1974  Jordan .............................. 324/73 R
4,253,059  2/1981  Bell et al. ......................... 324/73 R

OTHER PUBLICATIONS

Ramamoorthy, C. V.; "A Structural Theory . . ."; AFIPS Conference Proc., 1967 Spring Joint Computer Conference 30; pp. 743-756.
Ramamoorthy, C. V.; "Analysis of Graphs . . ."; J. of Assoc. for Computing Machinery; vol. 13; No. 2; Apr. 1966; pp. 211-222.
Tietze et al.; "Halbleiter-Schaltungstechnik"; 4th Edition, 1978; pp. 77-135.

Primary Examiner—Ernest F. Karlsen
Attorney, Agent, or Firm—Thomas A. Briody; Robert T. Mayer; Steven R. Biren

[57] ABSTRACT

In order to improve yield, integrated circuits may advantageously be tested using internal test circuitry during fabrication to locate faults. In order to conduct the necessary tests without providing an extra external test connection, the invention contemplates using a required existing terminal of an integrated circuit along with a test circuit which is activated by a voltage outside the normal operating voltage range, such as a voltage of opposite polarity to that used during normal operation.

2 Claims, 1 Drawing Figure

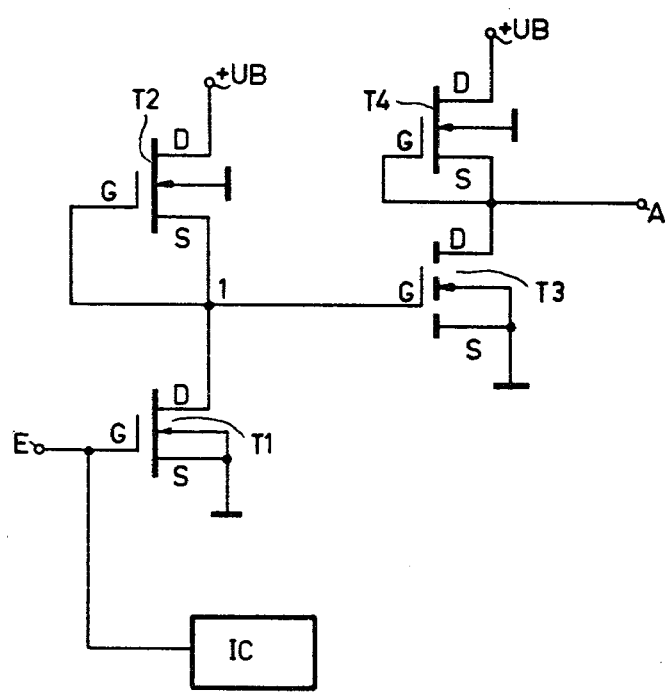

INTEGRATED CIRCUIT ARRANGEMENT IN MOS-TECHNOLOGY WITH FIELD-EFFECT TRANSISTORS

BACKGROUND OF THE INVENTION

The invention relates to an integrated circuit arrangement in MOS-technology with field-effect transistors, comprising at least one test circuit which also employs MOS-technology and field-effect transistors, the test connection or connections of said test circuit being externally accessible, via which connections at least parts of the integrated circuit arrangement can be tested when a test signal is applied, and each field-effect transistor is connected to ground or to a negative voltage with its substrate connection.

Such integrated circuit arrangements are generally known. If these arrangements comprise a multitude of transistors, for example in MOS-technology with field-effect transistors, a precise analysis of faults made during fabrication, in order to eliminate the faults, is often difficult. For this purpose it is known to construct the integrated circuit in the so-called IC arrangement, which may comprise for example 16 or 24 connections, and to connect certain points of the circuit arrangement, via further integrated circuit arrangements, to the external connections in such a way that the circuit arrangement can be tested by means of test signals. Literature relating to this subject is the following: AFIPS Conference Proceedings, 1967 Spring Joint Computer Conference 30, pages 743 to 756, entitled "A structural theory of machine diagnosis" by Ramamoorthy and a publication by the same author in the "Journal of the Association for Computing Machinery" Vol. 13, no. 2 of April 1966, pages 211 to 222. From these two references it is known to divide a very intricate integrated circuit arrangement, especially one developed for microprocessors, in such a way that separate blocks are formed, between which the so-called internal connection points are located, which in their turn are then connected, either directly or via further integrated circuits, to the connections in such a way that for the purpose of testing the individual parts well-defined signals are produced on these connections, in order to obtain production mounting in the so-called micro-electronic technology and in order to be able to ascertain on which points an erroneous signal appears or in order to be able to ascertain in which part of the complex integrated circuit arrangement faults have been made during fabrication.

Furthermore, it is known from the book by "U. Tietze and Ch. Schenk", "Halbleiter-Schaltungstechnik", 4th edition 1978, inter alia pages 77 et seq, what types of field-effect transistors exist, how the circuit symbols for the types are and how said field-effect transistors are to be operated.

If such test points are not provided, the fabrication of such complex integrated circuit arrangements must be followed by a sorting operation in which as a result of the occurrence of various defects many IC's are rejected so that only a few IC's are left, for example only 10% of the total production. In order to increase this low yield, the aforementioned test circuits have been developed and are already in use, permitting the effective location and elimination of faults during fabrication, so that a substantially higher yield can be achieved, reject percentages being obtained which, depending on the size of the circuit arrangement, may for example be 10% and smaller.

In the known test method, which is also used by the Applicant, the test signal is always applied to an integrated circuit arrangement with the same polarity with which the integrated circuit arrangement is operated during its normal use. This means that when so-called n-channel field-effect transistors have been employed, the operating voltages for the normal IC are then 0 on the ground connection and a positive supply voltage of for example +5 V, +12 V or +15 V. For MOS-technology only the +5 V voltage is used in most cases. The test voltage which should now be applied to the connections for testing these IC's then also has the same direction, i.e. positive test voltage pulses are applied to the various connections and on other connections, depending on the structure of the circuit arrangement, these test voltages are available, so that it can be determined whether these test signals exhibit the correct waveform or not. During fabrication it is also possible to have access to the so-called internal connection points and to ascertain in which parts of such a circuit arrangement faults occur. For this purpose it is known to provide an additional connection for the application of the test signal, which connection is not necessary for the normal operation of the IC, i.e. a connection which is to be provided in addition to the normally available connections, solely for the purpose of testing.

SUMMARY OF THE INVENTION

It is the object of the invention to dispense with said additional connection. Indeed, if the highly complex IC component with the integrated circuit arrangement is to have a minimal number of connections, it is undesirable to provide this IC with a special connection for testing during fabrication, because this will lead to larger structures and more connections.

In order to solve this problem, the test circuit in an integrated circuit arrangement in MOS-technology with field-effect transistors of the type mentioned above is designed according to the invention such that test signals can be applied which have a polarity opposite to that of the normal supply voltage of the integrated circuit arrangement.

The use of the concept in accordance with the invention thus enables the additional connection to be dispensed with and a voltage which is negative relative to the normal voltage to be applied to connections which during normal operation have an entirely different function for the purpose of testing, and thus the test to be performed.

An embodiment of the invention for such a test circuit comprises a first field-effect transistor of the depletion type, whose substrate and source connections are connected to ground, whose gate connection is connected to an external connection to which the integrated circuit arrangement is also connected, and whose drain connection is connected to an internal connection point, to which moreover the gate as well the source connection of a second field-effect transistor of the depletion type are connected, whose substrate connection is connected to ground and whose drain connection is connected to the supply voltage, that furthermore a third field-effect transistor of the enhancement type is connected to the internal connection point, whose source connection is connected to ground and whose drain connection is connected to the internal output, to which furthermore the gate and the source connection of a fourth field-effect transistor of the depletion type are connected, whose substrate connection is connected to ground and whose drain connection is connected to the supply voltage.

Thus, in such a circuit arrangement there is provided one external connection, to which during normal operation of the integrated circuit arrangement the so-called integrated circuit arrangement is connected, but to which external connection in the case of testing a negative voltage is applied. As a result of this the circuit arrangement in accordance with the invention then becomes operative, which circuit during normal operation of the integrated circuit has no function, i.e. is inoperative. The embodiment shown comprises four field-effect transistors, which during normal operation of the integrated circuit, i.e. of the so-called IC, have no function and become operative only if a test is to be performed. These four transistors are negligible in size in comparison with the thousands of transistors normally included in such a circuit arrangement with MOS field-effect transistors. In an IC a plurality of such circuits in accordance with the invention may be included, the internal outputs always being situated so that parts of the circuit become accessible, which enable individual blocks of integrated circuit arrangements to be tested so that faults in the fabrication can be detected, as stated previously.

BRIEF DESCRIPTION OF THE DRAWING

An embodiment of the invention is shown in the single FIGURE of the drawing and is described in more detail hereinafter.

DETAILED DESCRIPTION

In the drawing, E is a connection, which is externally accessible and to which during normal operation of the IC the integrated circuit arrangement, designated by block IC, is connected. This arrangement may for example comprise flip-flops, operational amplifiers, NAND, NOR or OR gates etc. and need not be described in more detail. Obviously, this IC has several other connections, such as for the supply voltage, in a known manner. During normal operation voltages between 0 and +5 V are applied to the connection E, which may be for example a connection for a gate or for an operational amplifier. As long as voltages in this voltage range appear on the connection E the circuit arrangement in accordance with the invention is inoperative. The circuit arrangement in accordance with the invention does not become operative until a negative signal, for example between 0 and −5 V, is applied to the external connection E.

The transistors T1, T2 and T4 in accordance with the invention are of the depletion type, i.e. when 0 V is applied to their inputs, the input signal in the present case being the voltage between the gate connection and the source connection, this transistor is conductive. Thus, if 0 V is applied to connection E, i.e. between G and S, transistor T1 is conductive. The drain and source connections of the transistor T1 are then connected to ground, i.e. the internal connection point 1 is also connected to ground, and as the G and S connections of transistor T2 are interconnected, these connections will also at 0 V be conductive; however, its path between the drain and source connections represents a specific resistance, so that the supply voltage +UB pulls connection point 1 high, because the resistance of the path between the drain and the source connection of transistor T1 also produces a certain voltage drop. If transistors T1 and T2 were to be made identical, the voltage drop across them is the same, and if the supply voltage +UB is +5 V, the voltage on the connection point 1 will be +2.5 V. Transistor T4 is also connected as a resistor, because its drain connection is connected to +UB and its source connection and its gate connection are interconnected. The output voltage at point A will then depend on whether or not the threshold turn-on voltage of enhancement-mode transistor T3 has been reached.

However, in the invention, the internal-resistance paths of the transistors T1 and T2 are made to differ in such a way that if a zero or a positive signal appears on the connection E, point 1 is always maintained virtually at earth level, i.e. if the resistance path in transistor T1 between the drain and source connections has a substantially lower resistance than the resistance junction between the drain and the source connection of transistor T2. The voltage on the gate connection of transistor T3 is then 0 and between its gate and source connections the voltage is also 0, so that said transistor T3 is fully cut off and, if the transistor T4 is designed appropriately with respect to its internal resistance path between the drain and source connections, a voltage of +5 V will appear on the internal output A.

If now for the purpose of testing a negative voltage signal is applied to connection E, i.e. for example −5 V, transistor T1 is cut off. The internal connection point 1 is then at the voltage +5 V and this positive voltage appears between the gate and the source connection of transistor T3, and turns on this transistor, so that point A is switched from the +5 V state to the 0 V state. Because the path between the drain and source connections of transistor T3 represents a very low resistance when dimensioned appropriately the output is switched from +5 V to substantially zero and can thus initiate specific operations in the interior of the integrated circuit arrangement.

Such a circuit arrangement in accordance with the invention may be connected to several different points within the IC, and the internal point A may now be connected to several blocks in the interior of the circuit arrangement, as is known from the present state of the art, so that it is possible to consecutively test individual blocks in the integrated circuit in order to ascertain in which block a fault occurs. The size of the blocks should be in conformity with the number of connections available, because the test signal should ultimately return to some connection of the IC, namely another external connection, so that for a test two connections must always be available. However, if two circuit arrangements in accordance with the invention are incorporated, this arrangement can be made so that several connections E and only one output connection exist, or the other way round. Several embodiments of this type of application of a test circuit are known from the reference "A structural theory of machine diagnosis" page 746, so that this requires no further explanation.

As stated in the foregoing, the principle of the invention is that no special connection for test purposes is provided in the IC, and that a special circuit is incorporated in the IC which enables operation with a test voltage having a polarity opposite to that of the normal operating voltage, and which initiates certain operations in the IC in order to detect faults solely when the test voltage is present.

In the integrated circuit arrangement in accordance with the invention, i.e. also in the test circuit in accordance with the invention, the so-called substrate connections, i.e. the connections designated by an arrow, may all be connected to ground as shown, but they may alternatively be connected to a negative voltage, for example to −2.5 V.

The embodiment shown relates to n-channel field-effect transistors. In an embodiment with p-channel field-effect transistors the polarities of the voltage values specified should be reversed.

What is claimed is:

1. An MOS field-effect transistor integrated circuit having an internal test circuit, which comprises:

an external connection to said integrated circuit having an operating voltage range of between zero and a selected voltage of a first polarity during the normal operating cycle of said integrated circuit, said external connection being required for the normal operation of said integrated circuit;

an internal test circuit input terminal which is internally connected to said external connection; and an internal test circuit output terminal which is internally connected to a selected location within said integrated circuit to provide a test activation signal to said selected location, said test circuit being activated by the application of a test signal of a second polarity opposite to that of said first polarity to said external integrated circuit connection.

2. An integrated circuit arrangement as claimed in claim 1, wherein said internal test circuit comprises a first field-effect transistor (T1) of the depletion type, whose substrate and source connections are connected to ground, whose gate connection is connected to said external connection (E), to which external connection the integrated circuit (IC) is also connected, and whose drain connection is connected to an internal connection point (1), to which connection point the gate as well as the source connection of a second field-effect transistor (T2) of the depletion type are connected, the substrate connection of the second transistor being connected to ground and its drain connection being connected to a supply voltage (+UB) of the first polarity, the gate connection of a third field-effect transistor (T3) of the enhancement type being connected to the internal connection point (1), the source connection of said third transistor being connected to ground and its drain connection being connected to the internal test circuit output (A), to which internal output the gate and the source connection of a fourth field-effect transistor (T4) of the depletion type are also connected, the substrate connection of said fourth transistor being connected to ground and its drain connection being connected to the supply voltage.

* * * * *